(12) United States Patent
Julien et al.

(10) Patent No.: US 10,332,808 B2
(45) Date of Patent: Jun. 25, 2019

(54) DEVICE COMPRISING MULTIPLE GATE STRUCTURES AND METHOD OF SIMULTANEOUSLY MANUFACTURING DIFFERENT TRANSISTORS

(71) Applicants: Commissariat a l'Energie Atomique et aux Energies Alternatives, Paris (FR); STMicroelectronics (Crolles 2) SAS, Crolles (FR); STMicroelectronics (Rousset) SAS, Rousset (FR)

(72) Inventors: Franck Julien, La Penne sur Huveaune (FR); Stephan Niel, Meylan (FR); Emmanuel Richard, Saint Pierre d'Allevard (FR); Olivier Weber, Grenoble (FR)

(73) Assignees: STMICROELECTRONICS (ROUSSET) SAS, Rousset (FR); STMICROELECTRONICS (CROLLES 2) SAS, Crolles (FR); COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/897,003

(22) Filed: Feb. 14, 2018

(65) Prior Publication Data
US 2018/0269115 A1 Sep. 20, 2018

(30) Foreign Application Priority Data
Mar. 14, 2017 (FR) ...................................... 17 52069

(51) Int. Cl.
*H01L 21/00* (2006.01)
*H01L 21/84* (2006.01)
(Continued)

(52) U.S. Cl.
CPC ........ *H01L 21/84* (2013.01); *H01L 21/28008* (2013.01); *H01L 21/82345* (2013.01);
(Continued)

(58) Field of Classification Search
CPC ............... H01L 21/84; H01L 21/28008; H01L 21/823462; H01L 27/1207; H01L 27/088; H01L 27/0924; H01L 27/092; H01L 29/51; H01L 29/66545; H01L 29/165; H01L 29/6656
See application file for complete search history.

(56) References Cited

U.S. PATENT DOCUMENTS

2007/0032021 A1 2/2007 Park
2009/0108296 A1 4/2009 Karve et al.
(Continued)

*Primary Examiner* — Nikolay K Yushin
(74) *Attorney, Agent, or Firm* — Seed IP Law Group LLP

(57) ABSTRACT

A method of manufacturing first, second, and third transistors of different types inside and on top of first, second, and third semiconductor areas of an integrated circuit, including the steps of: a) depositing a first dielectric layer and a first polysilicon layer on the third areas; b) depositing a second dielectric layer on the second areas; c) depositing an interface layer on the first areas; d) depositing a layer of a material of high permittivity and then a layer of a metallic material on the first and second areas; e) depositing a second polysilicon layer on the first, second, and third areas; f) defining the gates of the transistors in the third areas; and g) defining the gates of the transistors in the first and second areas.

20 Claims, 3 Drawing Sheets

(51) Int. Cl.
- *H01L 29/51* (2006.01)
- *H01L 21/8234* (2006.01)
- *H01L 21/28* (2006.01)
- *H01L 27/12* (2006.01)
- *H01L 27/092* (2006.01)

(52) U.S. Cl.
CPC .. *H01L 21/823462* (2013.01); *H01L 27/0922* (2013.01); *H01L 27/1207* (2013.01); *H01L 29/51* (2013.01)

(56) References Cited

U.S. PATENT DOCUMENTS

| | | |
|---|---|---|
| 2014/0312423 A1 | 10/2014 | Cheng et al. |
| 2015/0069524 A1 | 3/2015 | Hong et al. |

DEVICE COMPRISING MULTIPLE GATE STRUCTURES AND METHOD OF SIMULTANEOUSLY MANUFACTURING DIFFERENT TRANSISTORS

BACKGROUND

Technical Field

The present disclosure relates to the manufacturing of electronic chips, and more particularly to the simultaneous manufacturing, on a same chip, of transistors operating at different voltages.

Description of the Related Art

It is desired to have different types of transistors capable of operating with different power supply voltages arranged within a same chip. Such transistors may for example be so-called low-voltage transistors (LV), so-called medium-voltage transistors (MV), and so-called high-voltage transistors (HV). Each type of transistor has a specific gate insulator with characteristics to be optimized for its operation.

The performances and the reliability of such components strongly depend on the features of their gate insulators. However, the methods used to form gate insulators optimized for different types of transistors within a same chip raise various implementation issues. It is thus desired to provide a method enabling to form different types of transistors within a same chip.

It is also desired to form these various transistors in the smallest possible number of steps.

BRIEF SUMMARY

Thus, an embodiment provides a method of manufacturing first, second, and third transistors of different types inside and on top of first, second, and third semiconductor areas of an integrated circuit, comprising the steps of: a) depositing a first dielectric layer and a first polysilicon layer on the third areas; b) depositing a second dielectric layer on the second areas; c) depositing an interface layer on the first areas; d) depositing a layer of a material of high permittivity and then a layer of a metallic material on the first and second areas; e) depositing a second polysilicon layer on the first, second, and third areas; f) defining the gates of the transistors in the third areas; and g) defining the gates of the transistors in the first and second areas.

According to an embodiment, step f) comprises: etching all the way to the first dielectric layer into the third areas to define gates; and forming first spacers.

According to an embodiment, step g) comprises: etching all the way to the semiconductor material first and second areas to define gates; and forming second spacers.

According to an embodiment, the thickness of the first polysilicon layer is in the range from 10 to 40 nm.

According to an embodiment, the thickness of the second polysilicon layer is in the range from 40 to 60 nm.

According to an embodiment, the first and second dielectric layers are made of silicon oxide.

According to an embodiment, the interface layer is made of silicon oxynitride.

According to an embodiment, the thickness of the interface layer is in the range from 0.8 to 1.5 nm.

According to an embodiment, the material of high permittivity is $HfO_2$.

According to an embodiment, the thickness of the material of high permittivity is in the range from 1.5 to 3 nm.

According to an embodiment, the metallic material is titanium nitride.

According to an embodiment, the thickness of the layer of metallic material is in the range from 3 to 10 nm.

According to an embodiment, each first spacer comprises a silicon oxide spacer and a silicon nitride spacer.

BRIEF DESCRIPTION OF THE SEVERAL VIEWS OF THE DRAWINGS

The foregoing and other features and advantages will be discussed in detail in the following non-limiting description of specific embodiments in connection with FIGS. 1A to 1F, which illustrate successive steps of an embodiment of a method of simultaneously manufacturing different types of transistors.

DETAILED DESCRIPTION

Figure 1A:
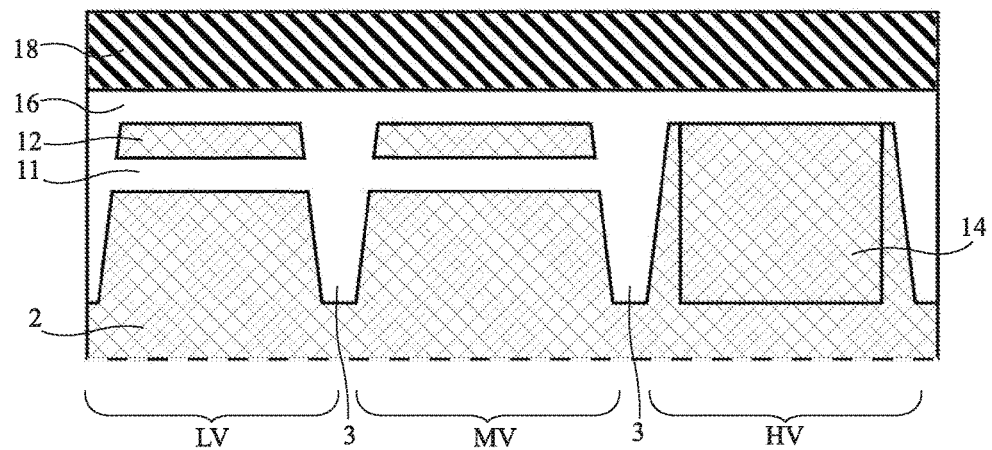

The same elements have been designated with the same reference numerals in the various drawings and, further, the various drawings are not to scale. For clarity, only those steps and elements which are useful to the understanding of the described embodiments have been shown and are detailed. In particular, the different masks used during the manufacturing are neither described, nor shown. Similarly, the various source and drain pre-implantation (LDD) and implantation steps are neither described, nor shown.

In the following description, when reference is made to terms qualifying a relative position, such as term "upper", reference is made to the position of the concerned elements in the drawings. Unless otherwise specified, expression "approximately" means to within 10%, preferably to within 5%.

FIGS. 1A to 1F illustrate an embodiment of a method of simultaneously manufacturing three transistors of different types on a substrate 2, for example, a silicon substrate. The three transistors are formed in areas separated by insulating trenches 3 called STI (for "Shallow Trench Insulation"). A so-called low-voltage transistor adapted to low power supply voltages, for example, of approximately 0.9 V, is formed in an LV area. A so-called medium-voltage transistor adapted to medium power supply voltages, for example, of approximately 1.8 V, is formed in an MV area. A so-called high-voltage transistor adapted to high power supply voltages, for example, of approximately 5 V, is formed in an HV area. Although a single transistor of each type has been shown, the method of course enables to simultaneously manufacture multiple transistors of these three types. Other components will also generally be formed in other locations inside and on top of the substrate.

FIG. 1A illustrates the result of an initial step. This initial step is carried out on a structure of silicon-on-insulator or SOI type. The transistors of the LV and MV areas are formed on top of and inside of portions of a thin silicon-on-insulator layer 12. In the HV area, where the high-voltage transistor will be formed, the thin silicon-on-insulator layer 12 and a buried insulator layer 11 have been removed and silicon has been epitaxially grown, so that the transistor formed in the HV area is actually a transistor on a solid substrate. STI insulating trenches 3 have been formed between the different LV, MV, and HV areas. At the level of the HV area, an implantation has been performed to optimize the doping of the corresponding region 14.

During this initial step, the three LV, MV, and HV areas are covered with an insulator layer 16, for example, silicon oxide, and with a conductive layer 18, such as a polysilicon layer.

Figure 1B:
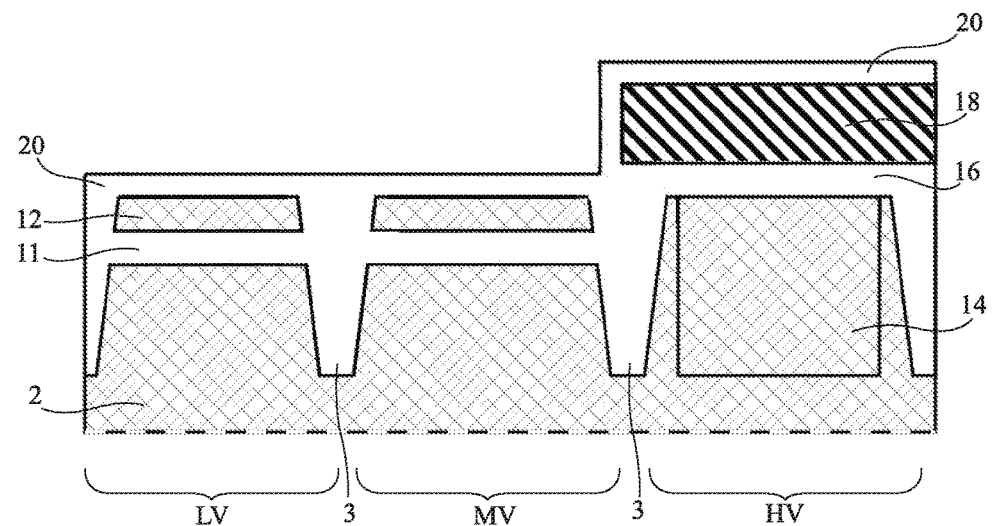

At the step illustrated in FIG. 1B, layers 16 and 18 are removed from the LV and MV areas, for example, by photolithography. Thus, insulating layer 16 is only kept in the HV area containing the high-voltage transistor which will have it as a gate insulator. Gate insulator layer 16 is protected all along the rest of the method by the presence of polysilicon layer 18 and is thus not affected by the various treatments intended for the forming of the LV and MV transistors.

The LV, MV, and HV areas are then covered with a layer 20 of a dielectric, for example, silicon oxide.

Figure 1C:
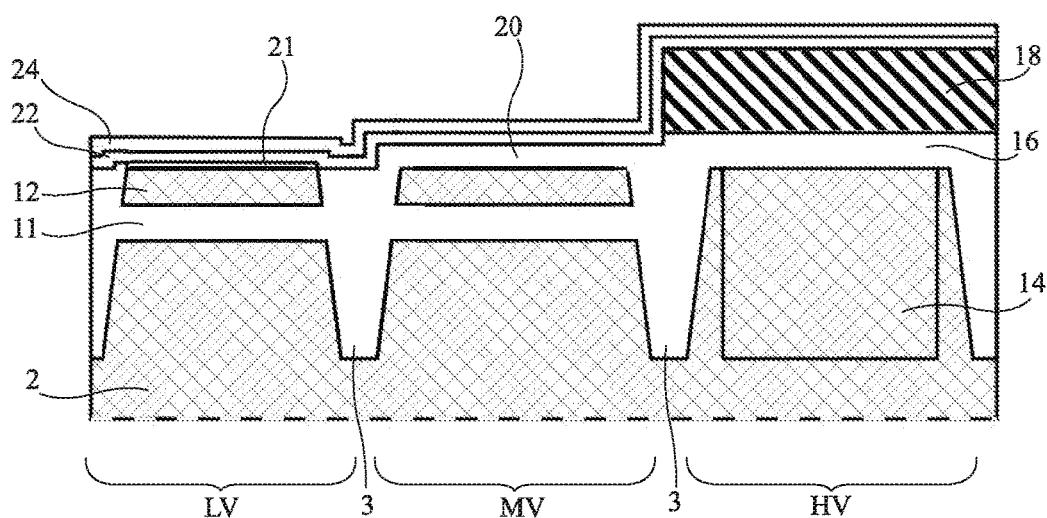

At the step illustrated in FIG. 1C, silicon oxide layer 20 is removed from the LV and HV areas and is only kept in the MV area. A dielectric interface layer 21 is formed on the LV area. The LV, MV, and HV areas are covered with a layer 22 of a material of high permittivity, or "high K" material, and layer 22 is covered with a layer 24 of a metallic material.

Silicon oxide layer 20 and layer 22 of the material of high permittivity will form the gate insulator of the medium-voltage transistor which will be formed in the MV area. Interface layer 21 and layer 22 of the material of high permittivity will form the gate insulator of the low-voltage transistor which will be formed in the LV area.

Dielectric layer 16, for example, made of silicon oxide, has a thickness for example in the range from 5 to 20 nm, for example, 15 nm. Dielectric layer 20, for example, made of silicon oxide, has a thickness in the range from 2 to 8 nm, for example, 4 nm. Interface layer 21, for example, made of silicon oxynitride obtained by thermal oxynitriding of the silicon 12 of the LV area, has a thickness in the range from 0.6 to 1.5 nm, for example, 1 nm. Layer 22 of the material of high permittivity, for example, $HfO_2$, has a thickness in the range from 1.5 to 3 nm, for example, 2 nm. Layer 24 of metallic material, for example, of titanium nitride, has a thickness in the range from 3 to 10 nm, for example, 5 nm.

Thus, at the end of the step of FIG. 1C, all the gate insulators of the three types of transistors have been formed. Gates as well as spacers will be formed during the steps illustrated in FIGS. 1D to 1F.

Figure 1D:
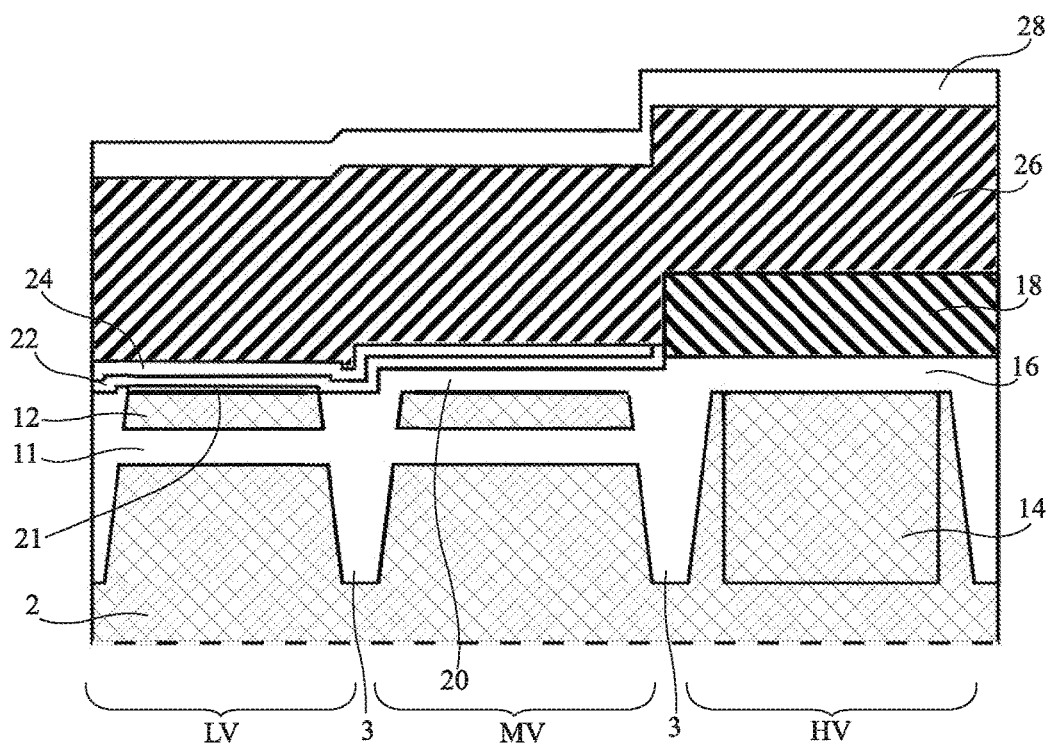

At the step illustrated in FIG. 1D, layers 22 and 24 of the material of high permittivity and of metallic material are removed from the HV area, one after the other or simultaneously. A second conductive layer 26, for example of polysilicon, and a dielectric layer 28 are formed over the LV, MV, and HV areas altogether. Layer 28 is for example made of silicon oxide.

As previously indicated, the presence of polysilicon layer 18 forms a protection for gate insulator layer 16 of the high-voltage transistor, in particular on removal of layers 22 and 24 of the material of high permittivity and of the metallic material of the HV area. This enables to keep the performances and the reliability of the high-voltage transistor which will be formed in the HV area. This also enables to form the HV transistor on a solid substrate while the LV and MV transistors are on a SOI-type structure. Indeed, while the work function of layer 24 of metallic material is selected to adjust the threshold voltages of the LV and MV transistors on a SOI-type structure, layer 24 is not, most often, adapted to the forming of a transistor on a solid substrate. A polysilicon gate conductor then enables to adjust the threshold voltage of the HV transistor independently from the LV and MV transistors.

Figure 1E:
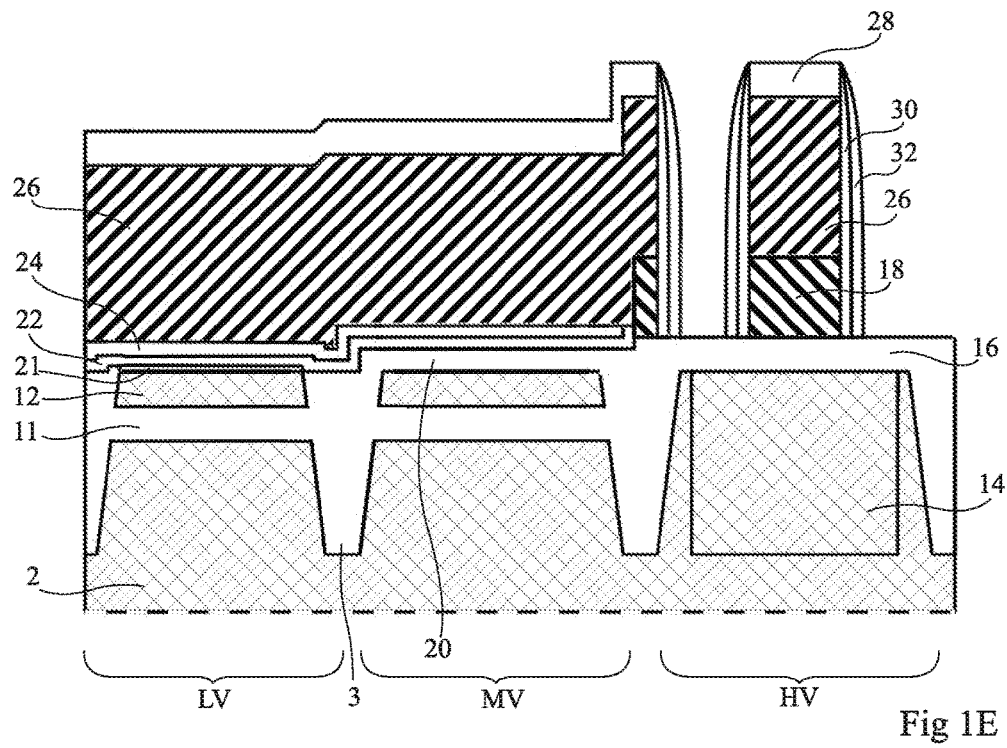

At the step illustrated in FIG. 1E, portions of the first and second polysilicon layers 18, 26 and silicon oxide layer 28 in the HV area are etched all the way to silicon oxide layer 16, to define a transistor gate formed of polysilicon layers 18 and 26, topped with silicon oxide layer 28. Spacers are formed on the sides of the gate of the high-voltage transistor. These spacers are for example silicon oxide spacers 30 and silicon nitride spacers 32 covering spacers 30.

Figure 1F:
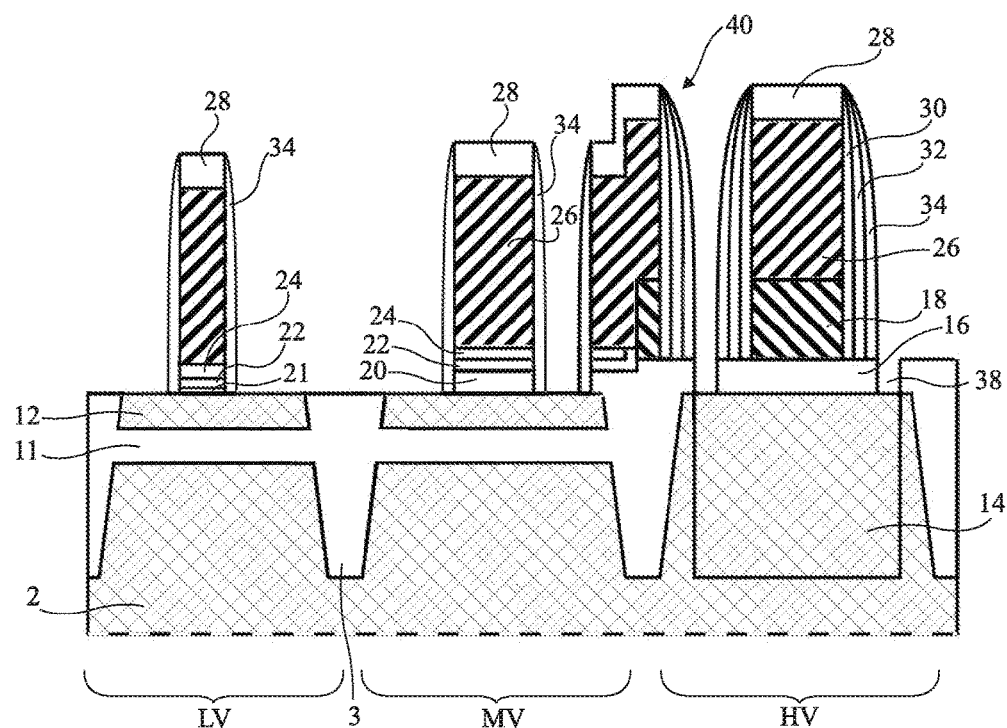

At the step of FIG. 1F, portions of the silicon oxide layer 28, polysilicon layer 26, metallic layer 24, high-K layer 22, and interface layer 21 in the LV area and portions of the silicon oxide layer 28, polysilicon layer 26, metallic layer 24, high-K layer 22, and silicon oxide layer 20 in MV area are etched all the way to the SOI layer 12, to define a gate in each LV and MV area. The gate insulator of the LV area is formed of interface layer 21 and of high-permittivity material layer 22. The conductive gate of the LV area is formed of metallic material layer 24 and of polysilicon layer 26, and is topped with silicon oxide layer 28. The gate insulator of the MV area is formed of silicon oxide layer 20 and of high-permittivity material layer 22. The conductive gate of the MV area is formed of metallic material layer 24 and of polysilicon layer 26, and is topped with silicon oxide layer 28. Spacers 34 are formed on the sides of the gates of the low- and medium-voltage transistors as well as on the sides of the spacers of the high-voltage transistor. Spacers 34 are, for example, made of silicon nitride.

The thickness of polysilicon layer 26 is selected according to the gate height desired for the low- and medium-voltage transistors. The gate height is in particular selected so that the implantations of the source and drain areas do not penetrate into the channel region under the gate. The thickness of polysilicon layer 26 is for example in the range from 40 to 60 nm, for example, 43 nm. The width of the spacers of the high-voltage transistor is a parameter which contributes to setting the power supply voltage at which the transistor can operate. The gate height of the high-voltage transistor, having the width of its spacers depending thereon, depends on the thicknesses of polysilicon layers 18 and 26. The thickness of layer 18, for example, in the range from 10 to 40 nm, enables to select a gate height capable of allowing the forming of spacers of desired width specifically for this HV transistor and independently from the LV and MV transistors. The total thickness of layers 18 and 26 is also selected according to the implantation depth desired for the source and drain areas of the HV transistor.

The gate of the transistor of the LV area has a length for example in the range from 25 to 30 nm, for example, 28 nm. The gate of the transistor of the MV area has a length for example in the range from 125 to 175 nm, for example, 150 nm. The gate of the transistor of the HV area has a length for example in the range from 450 to 550 nm, for example, 500 nm.

Openings 38 are etched into gate insulator layer 16 of the high-voltage transistor. Openings 38 are formed to allow a contact with the source and drain areas of the high voltage transistor formed in region 14 of substrate 2.

The different steps of the manufacturing method have left an artifact 40 on insulating trench 3 separating the HV area from the LV and MV areas. This artifact is formed of various layers formed along the manufacturing method, for example, polysilicon layers 26 and 18, as well as spacers 30, 32, and 34. This artifact in not electrically used. However, this artifact may for example be useful on deposition of a protection layer, not shown, fully covering the transistors, to help leveling this protection layer.

After the step illustrated in FIG. 1F, the conventional transistor-forming steps are carried out. These steps for example comprise an implantation, an epitaxial growth of the silicon, a siliciding, and the forming of contacts.

An advantage of this embodiment is that it enables to manufacture, side by side, different types of transistors, particularly high-voltage transistors having their gate comprising a polysilicon thickness greater than that of the other transistors, by adding but a small number of steps in the manufacturing method. This embodiment also enables to suppress layer 22 of high-permittivity material and layer 24 of metallic material in the HV area without affecting silicon oxide layer 16 forming the gate insulator.

In addition to the co-integration of LV and MV transistors having different gate insulators, this embodiment thus enables to:

ensure that the gate insulator of the HV transistors is not affected by the next depositions;

co-integrate transistors comprising a layer of a material of high permittivity and a layer of a metallic material with transistors having their gate conductor only made of polysilicon. This eases, in particular, the co-integration of transistors on a SOI-type structure and of transistors on a solid substrate. Indeed, these two types of transistors require gates with different work functions; and co-integrate low-voltage transistors and high-voltage transistors having gate heights greater than that of the low-voltage transistors. This enables to increase the implantation depth and to increase the size of the spacers of the high-voltage transistors.

Thus, the embodiment discussed herein provides means for optimizing the performances of a high voltage transistor and for co-integrating it with low- and medium-voltage transistors, the manufacturing thereof being strongly interdependent (only the gate insulator thickness differentiates them).

Various alterations, modifications, and improvements will occur to those skilled in the art. In particular, the transistors described as being formed on SOI may also be transistors formed on solid silicon. Further, it is possible to manufacture low-voltage and high-voltage transistors alone, that is, without manufacturing medium-voltage transistors.

Such alterations, modifications, and improvements are intended to be part of this disclosure, and are intended to be within the spirit and the scope of the present disclosure. Accordingly, the foregoing description is by way of example only and is not intended to be limiting.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
manufacturing first, second, and third transistors of different types inside and on top of first, second, and third semiconductor areas, respectively of an integrated circuit, the manufacturing including:
depositing a first dielectric layer and a first polysilicon layer on the third semiconductor area;
depositing a second dielectric layer on the second semiconductor area;
depositing an interface layer on the first semiconductor area;
depositing a high permittivity layer and a metallic layer on the first and second semiconductor areas;
depositing a second polysilicon layer on the first, second, and third semiconductor areas;
defining a gate of the third transistor on the third semiconductor area; and
defining gates of the first and second transistors on the first and second semiconductor areas, respectively.

2. The method of claim 1, wherein defining the gate of the third transistor comprises etching the first and second polysilicon layers completely down to the first dielectric layer; the method further comprising forming spacers on opposite sides of the gate of the third transistor.

3. The method of claim 1, wherein:
defining the gate of the first transistor comprises etching the second polysilicon layer, high permittivity layer, and interface layer completely down to the first semiconductor area; and
defining the gate of the second transistor comprises etching the second polysilicon layer, high permittivity layer, and second dielectric layer completely down to the second semiconductor area, the method further comprising:
forming spacers on opposite sides of the gates of the first and second transistors.

4. The method of claim 1, wherein the first polysilicon layer has a thickness in a range from 10 to 40 nm.

5. The method of claim 1, wherein the second polysilicon layer has a thickness in a range from 40 to 60 nm.

6. The method of claim 1, wherein the first and second dielectric layers are made of silicon oxide.

7. The method of claim 1, wherein the interface layer is made of silicon oxynitride.

8. The method of claim 7, wherein the interface layer has a thickness in a range from 0.6 nm to 1.5 nm.

9. The method of claim 1, wherein the high permittivity layer is $HfO_2$.

10. The method of claim 1, wherein the high permittivity layer has a thickness in a range from 1.5 to 3 nm.

11. The method of claim 1, wherein the metallic layer is titanium nitride.

12. The method of claim 11, wherein the metallic layer has a thickness in a range from 3 to 10 nm.

13. The method of claim 1, further comprising forming silicon oxide spacers and silicon nitride spacers on the gate of the third transistor.

14. The method of claim 1, further comprising, forming the third semiconductor area by steps including:
removing a portion of a silicon-on-layer and a portion of a buried insulator layer from atop a portion of a substrate; and
forming epitaxial semiconductor material on the portion of the substrate from which the portion of a silicon-on-layer and the portion of a buried insulator layer were removed.

15. A method, comprising:
removing a portion of a silicon-on-insulator layer positioned above a portion of a buried insulator layer formed on a substrate;
removing the portion of the buried insulating layer;
forming an epitaxial region on a portion of the substrate from which the portion of the silicon-on-insulator layer and the portion of a buried insulator layer were removed;

forming a first dielectric layer and a first polysilicon layer on the epitaxial region;

forming an interface layer on a first semiconductor area of the silicon-on-insulator layer;

forming a second dielectric layer on a second semiconductor area of the silicon-on-insulator layer;

depositing a high permittivity layer and a metallic layer on the interface layer and the second dielectric layer;

depositing a second polysilicon layer on the first, second, and third semiconductor areas;

defining a gate of a first transistor by etching the second polysilicon layer, high permittivity layer, and interface layer completely down to the first semiconductor area;

defining a gate of a second transistor by etching the second polysilicon layer, high permittivity layer, and second dielectric layer completely down to the second semiconductor area; and defining a gate of a third transistor by etching the first and second polysilicon layers completely down to the first dielectric layer.

16. The method of claim 15, further comprising:

forming first spacers on opposite sides of the gate of the third transistor before defining the gates of the first and second transistors; and forming second spacers on opposite sides of each of the gates of the first and second transistors after defining the gates of the first and second transistors.

17. The method of claim 15, wherein forming the interface layer, forming the second dielectric layer, depositing the high permittivity layer and the metallic layer, depositing the second polysilicon layer, and defining the gates of the first, second, and third transistors are performed after forming the first dielectric layer and the first polysilicon layer on the epitaxial region and while the first dielectric layer and the first polysilicon layer are positioned on the epitaxial region.

18. A device, comprising:

a substrate;

a silicon-on-insulator layer positioned on a buried insulator layer, the silicon-on-insulator layer and buried insulator layer being positioned on first and second areas of the substrate without covering a third area of the substrate;

an epitaxial region formed on the third area of the substrate;

a first gate structure positioned on a first portion of the silicon-on-insulator layer that is positioned on the first area of the substrate, the first gate structure including an interface layer on the first portion, a first high permittivity layer on the interface layer, a first metal layer on the first high permittivity layer, and a first conductive layer on the first metal layer;

a second gate structure positioned on a second portion of the silicon-on-insulator layer that is positioned on the second area of the substrate, the second gate structure including an first dielectric layer on the second portion, a second high permittivity layer on the first dielectric layer, a second metal layer on the second high permittivity layer, and a second conductive layer on the second metal layer; and a third gate structure positioned on the epitaxial region, the third gate structure including a second dielectric layer on the epitaxial region, a third conductive layer on the second dielectric layer, and a fourth conductive layer on the second conductive layer.

19. The device of claim 18, wherein the first, second, third, and fourth conductive layers are polysilicon layers.

20. The device of claim 18, further comprising:

a first insulating trench positioned between the first and second portions of the silicon-on-insulator layer; and a second insulating trench positioned between the epitaxial region and the first and second portions of the silicon-on-insulator layer.

* * * * *